United States Patent [19]

Unruh

[11] Patent Number: 5,705,463
[45] Date of Patent: Jan. 6, 1998

[54] COMPOSITION AND PROCESS FOR REMOVAL OF IONIC SALT DEPOSITS

[75] Inventor: Greg Roland Unruh, Amarillo, Tex.

[73] Assignee: Tech Spray, Inc., Amarillo, Tex.

[21] Appl. No.: 21,797

[22] Filed: Feb. 24, 1993

[51] Int. Cl.$^6$ ........................................ G01N 31/22
[52] U.S. Cl. ............... 510/175; 510/505; 510/506; 448/447; 427/304; 436/501
[58] Field of Search .......................... 252/170, 171, 252/DIG. 11; 436/501; 448/447; 427/304; 510/175, 505, 506

[56] References Cited

U.S. PATENT DOCUMENTS

| | | | |
|---|---|---|---|
| 4,367,072 | 1/1983 | Vogtle et al. | 436/501 |
| 4,636,441 | 1/1987 | Sirinyan et al. | 428/447 |
| 4,661,384 | 4/1987 | Sirinyan et al. | 427/304 |

*Primary Examiner*—Douglas J. McGinty
*Assistant Examiner*—Necholus Ogden
*Attorney, Agent, or Firm*—William D. Jackson; Locke Purnell Rain Harrell

[57] ABSTRACT

A composition and method for the removal of ionic salt deposits from a surface using an organic solvent of low polarity and a complexing agent. The complexing agent is chosen from a group which includes podands, cryptands, and coronands. The method provides nearly complete removal of ionic salt deposits with a single washing of the surface with the low polar cleaning mixture.

6 Claims, No Drawings

COMPOSITION AND PROCESS FOR REMOVAL OF IONIC SALT DEPOSITS

TECHNICAL FIELD OF THE INVENTION

The present invention relates to a composition and process for removal of salt deposits. More specifically, the present invention relates to a composition and process for the cleaning of surfaces contaminated with ionic salt deposits using an organic solvent mixture having a low polarity.

BACKGROUND OF THE INVENTION

Ionic salt residue on the surface of a substrate material is a reoccurring problem. In particular, printed circuit boards are prone to heavy salt deposit concentrations following the soldering precess. Printed circuit boards are manufactured in mass by a process known as wave soldering. Prior to the soldering process, a liquid flux compound is applied to the boards to insure proper adhesion of the solder joints. The flux compounds can be rosin acid based, organic acids or synthetically activated. The heat of the soldering process causes the component materials of the flux compound to decompose thereby liberating inorganic acids which react with any oxides present on the circuit board. The reaction insures solderability by removing the oxides, but the reaction produces ionic salts which are deposited on the printed circuit boards. The salt deposits are a problem because they can be corrosive. Moreover, a salt deposit can act as a bridge that can short circuit the board.

Printed circuit boards and other objects which must be free of salt deposits are cleaned in commercial washing processes, which can be batch or in-line processes. Most commercial processes consist of multiple steps in which the surface is submerged and sprayed with a cleaning solution, and then rinsing the objects with pure cleaning solution. Organic solvents or aqueous solutions can be used as cleaning solutions, but the organic solvent must have a low polarity because polar solvents are too flammable to be safely used in commercial processes. However, organic solvents having a low polarity are inefficient at solvating ionic salt residue, and when used as the cleaning solution, a significant amount of ionic salt residue remains undissolved. Therefore, the wash process must be repeated over and over again which increases production cost. Likewise, aqueous solutions are inefficient because the high surface tension of water based solutions prevents effective cleaning where the line spacings are less than about 1 mil. Moreover, aqueous solutions are largely ineffective at dissolving organic rosin acids.

Therefore, a need exists for a method for cleaning salt deposits from objects that is efficient and safe. The method should provide nearly complete removal of ionic salt residue in a single cleaning cycle. A need also exists for a cleaning composition that is effective at removing ionic salt deposits with a single cleaning cycle. The composition should be of a low polarity so that it can be safely used in commercial processes.

SUMMARY OF THE INVENTION

The present invention relates to the use of ligands as additives to existing solvents and solvent blends to insure nearly complete removal of ionic salt residues. The ligands useful in carrying out this invention include compounds falling in the categories of podands, coronands and cryptands all of which exhibit the property of efficiently transferring ionic salt compounds into an organic phase.

Specifically, coronands are single ring compounds having donor atoms with unshared pairs of electrons. Coronands include the crown ethers which have oxygen atoms as the donor atom. Cryptands are compounds having a ring structure with donor atoms, but the ring is bridged by additional chains which also have donor atoms. Finally, podands are compounds similar to cryptands and coronands because they have donor atoms, but podands differ from cryptands and coronands because they are open-chained compounds.

The cleaning mixture consists of an organic solvent of a low polarity and a ligand selected from at least one of the groups set out above in a ratio of between about 0.001 and 0.1 weight percent. The resulting composition is a cleaning mixture that can efficiently clean ionic salt residue from contaminated surfaces in a single wash cycle. In addition, the cleaning mixture has a low polarity, so it can be safely used in commercial cleaning processes. The cleaning mixture can be tailored for use in removing particular salt deposits by using a ligand that is selective to the cation of the targeted salt deposit. The cleaning mixture is particularly useful in cleaning salt residue on printed circuit boards, and it may be used as the cleaning mixture in existing commercial cleaning processes.

The method of cleaning a contaminated surface may simply involve exposing contaminated surface to the cleaning mixture, but the preferred cleaning methods include the multi-step methods currently used in commercial processes in which the cleaning mixture has been prepared in accordance with the current invention. However, the cleaning mixture is very effective and merely contacting the surface with the solution provides effective removal of salt deposits.

Following the cleaning process, an aqueous wash can be used to remove the salt ions from the cleaning mixture. The ligand additives remain in the organic solvent, so the cleaning mixture can be used repeatedly.

DETAILED DESCRIPTION OF THE INVENTION

The present cleaning mixture and its related method of use overcome many of the disadvantages found in the prior art. The present cleaning mixture is a mixture of ligands, also known as complexing agents, added to organic solvents having a low polarity. The cleaning mixture is particularly useful in removing salt deposits from printed circuit boards; however, the cleaning mixture can be used to clean salt deposits from any surface that is otherwise impervious to organic solvents.

The solvents that can be used in accordance with this invention include the low polar organic solvents currently used in commercial cleaning processes. For example, these organic solvents include alkyl halides, aliphatic monohydric alcohols, non-halogenated paraffins, aromatics, and a mixture thereof. The solvent may include a stabilizer such as nitromethane to prevent hydrolysis. The preferred organic solvents include alkyl halides and aliphatic monohydric alcohols having 1 to 3 carbon atoms, linear or branched non-halogenated paraffins having 5 to 30 carbon atoms, aromatics having 6 to 9 carbon atoms in a ring, or a mixture thereof. The more preferred organic solvents are Trichloromonoflouromethane (CC13F); 1,1,2-Trichloro-1,2,2-trifluoroethane (CC12FCC1F2); 1,1-Dichloro-2,2,3,3,3-pentafluoropropane (CHC12CF2CF3); 1,1-Chloro-1-fluoroethane (CC12FCH3); 1,1,1,2-Tetrafluoroethane (CF3CH2F); 2,2-Dichloro-1,1,1-trithoroethane (CHC12CF3); Ethyl Alcohol (CH3CH2OH); Isopropyl Alcohol (CH3CHOHCH3); Methyl Alcohol (CH3OH); a blend of 1,1,2-Trichloro-1,2,2-trifluoroethane and Methylene Chloride; a blend of 1,1,2-Trichloro-1,2,2-trifluoroethane, Isopropanol, and Nitromethane; a blend of 1,1,2-Trichloro-1,2,2-trifluoroethane, Ethanol, and Nitromethane; a blend of 1,1,2-Trichloro-1,2,2-trifluoroethane, Methanol, and Nitromethane; Xylene; Toluene; and the solvents sold under the trade name ISOPAR™ manufactured by Exxon.

The complexing agents which may be used in accordance with this invention are cyclic and acyclic ligands having donor atoms such as oxygen, nitrogen, phosphorous, or sulfur with unshared pairs of electrons. The complexing agents exhibit the property of efficiently solvating cations. Without limiting the scope of the present invention, it is believed that complexing agents assume a shape due to their chemical or physical nature which aligns the donor atoms in close proximity which creates an electronegative area that can form ion-dipole bonds with cations. The complexing agent and the cation have a Host-Guest Relationship with the complexing agent acting as the host and the cation acting as the guest, and the resulting structure is known as a complex compound. The complex compound is new cation having a lipophilic outer surface which makes it soluble in organic solvents of low polarity. When it enters such solvents, it takes an anion with it. The anion is shielded from the positive charge on the guest ion by the bulky host molecule.

In spite of the extensive investigation of the chemistry of coronands, podands, and cryptands with regard to synthesis and complexing characteristics, nothing in the prior art has suggested combining ligand chemistry with industrial cleaning solvents or methods. For example, U.S. Pat. No. 3,560,257 discloses the use of complex compounds in a solution used for the electroless deposition of metal on a substrate material, and U.S. Pat. Nos. 4,636,441 and 4,661,384 disclose crown ethers, cryptands, and podands as ligands particularly suitable for solutions used in electroless metallization processes.

U.S. Pat. No. 4,367,076 discloses the use of ligands, and in particular coronands, cryptands, and podands, as complexing agents used for selective photometric determination of the components in a liquid. The ligands are bonded to chromophore material, and the wavelength displacement of the solution changes as complex compounds are formed.

U.S. Pat. Nos. 4,395,527, 4,480,009, and 4,499,149 disclose the use of crown ethers and cryptands as phase transfer catalyst which facilitate the contact between the solid phase salt and the liquid phase disiloxane. The patents indicate that the ligand exchanges an anion with the salt, and then the ligand takes the anion from the salt into the organic phase where it can be reacted with the disiloxane. Such an exchange of anions could leave salt deposits on the surface because the salt cation and the ligand anion remain separate from the complex compound, and they are not solvent in the organic solvent.

Ionic salt residues are frequently formed with alkali metal and alkaline earth metal cations. The alkali metals can include, for example, sodium, potassium, rubidium, and cesium, and the alkaline earth metals can include, for example, magnesium, calcium, and strontium. Complexing agents chosen from the groups consisting of coronands, cryptands, podands, and derivatives thereof are preferred for the removal of these salts because these complexing agents are ideally suited for bonding with alkali metal and alkaline earth metal cations.

Coronands are multidentate monocyclic ligands without limitation on the type of donor atoms available and have the general formula

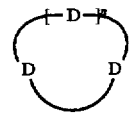

Wherein

D is a donor atom, n is the number of repeating donor atoms, and

⌢ is a chain segment without donor atoms.

As an example, a specific coronand with oxygen, nitrogen and sulfur donor atoms separated by ethyl groups is shown in the formula

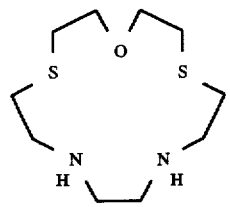

Cryptands are multidentate oligocyclic spherical ligands having a ring structure which has been bridged by a chain containing donor atoms and which is joined to the ring by Bridgehead atoms. Cryptands have the general formula

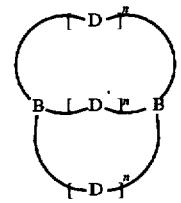

Wherein

D is a donor atom, n is the number repeating donor atoms, and

B is a bridgehead atom.

A specific cryptand having sulfur and oxygen as donor atoms and nitrogen as bridgehead atoms is shown in the formula

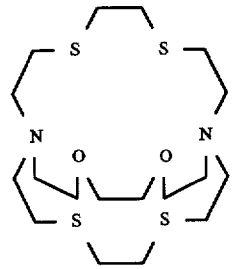

Podands are multidentate acyclical ligands having the general formula

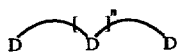

Wherein

D is a donor atom and n is the number of repeating donor atoms.

Podands function in a similar manner as coronands and cryptands by forming nearly cyclic shapes. A typical podand having oxygen as donor atoms separated by ethyl groups and having methyl terminating groups is shown in the formula

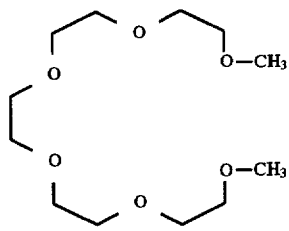

In addition, coronands, cryptands, and podands can be bonded to adjacent compounds via anchoring atoms. A coronand which has been anchored to another coronand may have the general formula

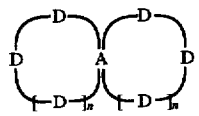

Wherein

D is a donor atom, n is the number of repeating donor atoms, and

A is an anchoring group.

Additional deletions and descriptions of coronands, cryptands and podands can be found in F. Vogle, *Host Guest Complex Chemistry; Macrocycles; Synthesis, Structure, Applications* (1985).

Coronands are the preferred ligand to be used in accordance with the present invention, and more preferred are the coronands known as crown ethers because they are particularly well suited to form complex compounds with an alkali metal or alkaline earth metal cation. The crown ethers are cyclic oligoether ligands exclusively containing oxygen as donor atoms. Examples of various crown ether structures include:

18-Crown-6:

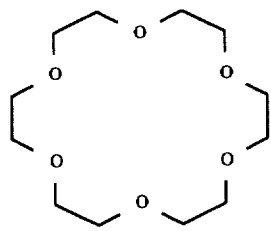

dibenzo-18-Crown-6:

dicyclohexyl-18-Crown-6:

Many different crown ethers can function as completing agents in accordance with this invention. However, an individual crown ether may display a selectivity for a specific cations, so the preferred crown ether is the one which can easily solvate the cation present on the contaminated surface. Apparently, crown ethers are specific to particular cations which closely fit within the ring where it is held by all the oxygen atoms in the ring. A partial list of crown ethers that may be used in accordance with the present invention and the cations for which they are specific is as follows:

| Crown Ether | Specific For: |
| --- | --- |
| 18-CROWN-6 | K+ > Na+ > Rb+ > Cs+ |
| DIBENZO-18-CROWN-6 | K+ > Na+ > Rb+ > Cs+ |
| DICYCLOHEXANO-18-CROWN-6 | K+ > Na+ > Rb+ > Cs+ |
| 12-CROWN-4 | Li+ > Na+ > K+ |
| 14-CROWN-4 | Li+ > Na+ > K+ |
| DIBENZO-14-CROWN-4 | Li+ > Na+ > K+ |
| BENZO-12-CROWN-4 | Li+ > Na+ > K+ |
| 15-CROWN-5 | Na+ > K+ |
| BENZO-15-CROWN-5 | Na+ > K+ |
| NAPTHO-15-CROWN-5 | Na+ > K+ |

The more preferred crown ethers are dibenzo-18-crown-6 and benzo-15-crown-5.

Preparation of the cleaning mixture involves mixing the solvent and the ligand to form a mixture of between about 0.001 and about 0.1 weight percent ligand. The preferable mixture has between about 0.005 and about 0.020 weight percent ligand. Thus the cleaning mixture retains the low polarity of the solvent so that it can be used in commercial cleaning process, but it gains the solvating qualities of the complexing agent so that effective cleaning with only one wash cycle is possible. In addition, the low-polar cleaning mixture can be used to clean printed circuit boards that are intended for purchasers with strict standards on allowable salt concentrations.

The cleaning mixture is very effective, so the method of cleaning a surface contaminated with salt deposits only requires contacting the cleaning mixture with the surface, so a method can be tailored to the specific surface to be cleaned. The preferred methods for cleaning a contaminated surface with the cleaning mixture include any combination of steps which submerge the surface in the cleaning mixture, spray the surface, and then rinse the surface. In addition, the method can be a batch or in-line process. A more preferred method of cleaning a surface, including printed circuit boards, has the following steps:

(1) Submerging of the surface in the cleaning mixture.

(2) Spraying the surface with the cleaning mixture.

(3) Rinsing the surface with a vapor phase organic solvent.

After a cleaning cycle, the cleaning mixture may be regenerated by an aqueous wash. In the presence of aqueous solution, the salt ions break away from the ligand and enter the aqueous phase, but the ligand remains in the organic phase. As a result, the cleaning mixture is returned to its original composition of an organic solvent containing uncomplexed ligands. A typical aqueous wash process requires a mixing step where the cleaning mixture and an aqueous solution are thoroughly mixed, and then the organic phase is decanted from the aqueous phase in a separation step.

EXAMPLE 1

Two test boards made of FR-4 epoxy-glass laminate were contaminated with sodium chloride salt deposits. One board was cleaned with pure 1,1,2-Trichloro-1,2,2-trifluoroethane and the other with a cleaning mixture containing 1,1,2-Trichloro-1,2,2-trifluoroethane and about 0.017% by weight Benzo-15-Crown-5 which is specific for the sodium cation. Each board was cleaned for six minutes in an ultrasonic cleaner at the boiling point of the respective solvent, and then each board was rinsed with pure 1,1,2-Trichloro-1,2,2-trifluoroethane.

The board cleaned in pure 1,1,2-Trichloro-1,2,2-trifluoroethane had a residue concentration of 118 ug/cm2 after cleaning, and the board cleaned with the crown ether cleaning mixture had a residue concentration of 3.8 ug/cm2.

EXAMPLE 2

Two test boards made of FR-4 epoxy-glass laminate were contaminated with sodium chloride salt deposits. One board was cleaned with a pure blend of 1,1,2-Trichloro-1,2,2-trifluoroethane and Methylene Chloride and the other with a cleaning mixture containing a blend of 1,1,2-Trichloro-1,2,2-trifluoroethane and Methylene Chloride and about 0.017% by weight Benzo-15-Crown-5. Each board was cleaned for six minutes in an ultrasonic cleaner at the boiling point of the respective solvent, and then each board was rinsed with a pure blend of 1,1,2-Trichloro-1,2,2-trifluoroethane and Methylene Chloride.

The board cleaned in a pure blend of 1,1,2-Trichloro-1,2,2-trifluoroethane and Methylene Chloride had a residue concentration of 201 ug/cm2 after cleaning, and the board cleaned with the crown ether cleaning mixture had a residue concentration of 5.4 ug/cm2.

Although preferred embodiments of the invention have been described in the foregoing Detailed Description, it will be understood that the invention is not limited to the embodiments disclosed, but is capable of numerous rearrangements, modifications, and substitutions of parts and elements without departing from the spirit of the invention. Accordingly, the present invention is intended to encompass such rearrangements, modifications, and substitutions of parts and elements as fall within the scope of the invention.

I claim:

1. A composition for removing ionic salt deposits from a surface which comprises:

(a) an organic solvent selected from a group consisting of alkyl halides, paraffinic monohydric alcohols, non-halogenated paraffins, aromatics and mixtures thereof;

(b) a complexing agent in a concentration of between about 0.001 weight percent and about 0.1 weight percent of the composition, wherein the complexing agent is a crown ether consisting of a monocyclic oligoether ligand exclusively containing oxygen as donor atoms and having non coordinated donor atoms so that the complexing agent can solvate ionic residue comprising a salt of an alkali metal or an alkaline earth metal by forming a guest/host relationship with the ionic residue; and (c) a stabilizing amount of a nitroparaffin in said solvent.

2. The composition of claim 1, wherein the organic solvent is selected from a group consisting of alkyl halides having between 1 and 3 carbon atoms; paraffinic monohydric alcohols having between 1 and 3 carbon atoms; linear or branched non-halogenated paraffins having 5 to 30 carbon atoms; aromatics having 6 to 9 carbon atoms in a ring; and mixtures thereof.

3. The composition of claim 1, wherein the organic solvent is an organic solvent selected from a group consisting of Trichloromonoflouromethane; 1,1,2-Trichloro-1,2,2-trifluoroethane; 1,1-Dichloro-2,2,3,3,3-pentafluoropropane; 1,1-Chloro-1-fluoroethane; 1,1,1,2-Tetrafluoroethane; 2,2-Dichloro-1,1,1-trifluoroethane; Ethyl Alcohol; Isopropyl Alcohol; Methyl Alcohol; a blend of 1,1,2-Trichloro-1,2,2-trifluoroethane and Methylene Chloride; a blend of 1,1,2-Trichloro-1,2,2-trifluoroethane, Isopropanol, and Nitromethane; a blend of 1,1,2-Trichloro-1,2,2-trifluoroethane, Ethanol, and Nitromethane; a blend of 1,1,2-Trichloro-1,2,2-trifluoroethane, Methanol, and Nitromethane; Xylene; Toluene; and ISOPAR™ solvents.

4. The composition of claim 1, wherein the crown ether is in a concentration between about 0.005 weight percent and about 0.02 weight percent of the composition.

5. The composition of claim 2, wherein the crown ether is in a concentration between about 0.005 weight percent and about 0.02 weight percent of the composition.

6. The composition of claim 3, wherein the crown ether is in a concentration between about 0.005 weight percent and about 0.02 weight percent of the composition.

* * * * *